| United States Patent [19] | [11] | 4,347,304 |
|---|---|---|
| Sakurai et al. | [45] | Aug. 31, 1982 |

[54] PROCESS FOR FORMING METALLIC IMAGE

[75] Inventors: Hideki Sakurai, Sendai; Mitsuo Nakatani, Yokohama; Hitoshi Oka, Yokohama; Hitoshi Yokono, Yokohama; Tokio Isogai, Fujisawa, all of Japan

[73] Assignee: Hitachi, Ltd., Tokyo, Japan

[21] Appl. No.: 277,049

[22] Filed: Jun. 24, 1981

[30] Foreign Application Priority Data

Jun. 25, 1980 [JP] Japan ................................. 55/85099
Jun. 25, 1980 [JP] Japan ................................. 55/85100

[51] Int. Cl.$^3$ .............................................. G03C 5/00
[52] U.S. Cl. ..................................... 430/291; 430/296; 430/315; 430/325; 430/942
[58] Field of Search ............... 430/291, 315, 325, 296, 430/942

[56] References Cited

U.S. PATENT DOCUMENTS

| 3,390,992 | 7/1968 | Nalles | 430/291 |
| 3,734,739 | 5/1973 | Jones et al. | 430/291 |
| 3,772,078 | 11/1973 | Polichette et al. | 430/315 |
| 4,268,536 | 5/1981 | Bechenbaugh et al. | 430/315 |
| 4,283,243 | 8/1981 | Andreades et al. | 430/291 |

*Primary Examiner*—Jack P. Brammer
*Attorney, Agent, or Firm*—Craig and Antonelli

[57] ABSTRACT

Metallic images of uniform quality can be formed on substrates having through-holes by a process using a positive type resist characterized by using as a coating solution for the substrate a solution of a photosensitive material of (a) at least one organic compound having at least one linkage of —M—M—M—$)_n$ (M=Si, Ge or Sn; n=0, 1 or more) in the molecule or (b) a mixture of at least one organic compound (a) mentioned above and at least one photosensitizer, dissolved in a solvent such as a halogenated hydrocarbon, an aromatic hydrocarbon, a heterocyclic compound, or a mixture thereof, followed by irradiation with an actinic light through a photomask and electroless plating.

8 Claims, No Drawings

PROCESS FOR FORMING METALLIC IMAGE

This invention relates to a process for optically forming a metallic image on a substrate.

For optically forming a metallic image on the surface of substrate such as plastics, ceramics or the like, there is known the negative type process by which a metallic image is formed on the exposed part of photosensitive material. However, for forming a circuit pattern of printed circuit board by the additive method by the use of a negative type material, it is necessary to expose the material layer of through-hole wall surface for the sake of producing plating nuclei. Nevertheless, it is quite difficult to expose with certainty all the material layers of through-hole wall surfaces which are large in number, because the through-holes have a small diameter and their wall surfaces are rough.

In contrast to it, if a positive type material is used, the unexposed part acts as a plating nucleus, so that plating nuclei can be formed with certainty on the through-hole wall surfaces. For example, a metallic image can be formed by coating a substrate with a positive type material containing a salt of metallic ion of which oxidized state changes upon irradiation with ultraviolet rays ($Sn^{+3}$, $Ti^{+3}$, $Pb^{+3}$ or the like), selectively exposing it to light so as to leave unexposed part usable as plating nucleus, and then dipping it in a chemical metal plating solution to deposit the metal on said unexposed part.

However, the above-mentioned process is disadvantageous in that the metallic salt applied to positive type material is so instable that the formed copper circuit is uneven in quality and therefore the yield of product is low.

It is an object of this invention to provide a process for forming a metallic image by the use of a positive type material by which the above-mentioned faults of prior technique can be overcome and a metallic image of uniform quality can be formed in a high yield.

This invention provides a process for forming a metallic image by coating a solution of a photosensitive material to the surface of substrate having through-holes and on the through-hole parts, drying the said solution, irradiating the resulting substrate with an actinic light through a photo-mask, and then contacting the substrate with a solution of metallic salt to deposit metal particles on the unexposed portions, characterized in that said photosensitive material is either one of the following (a) and (b):

(a) at least one kind of compound selected from organic compounds having in the molecule at least one linkage of the formula: $-M-M-(-M)_{\overline{n}}$, wherein M is an atom selected from the group consisting of Si, Ge and Sn and n is 0 or a figure of 1 or greater and preferably an integer of 1-10 (hereinafter, said organic compounds are referred to as "polymetal compounds");

(b) a mixture of at least one above-mentioned compound (a) and at least one kind of photosensitizer selected from the group consisting of nitrofluorene, nitrofluorene derivatives, benzophenone, benzophenone derivatives, acetophenone, acetophenone derivatives, benzil, benzil derivatives, benzoin and benzoin derivatives; and a solvent for dissolving the photosensitive material selected from the following group (c):

(c) halogenated hydrocarbons, aromatic hydrocarbons and heterocyclic compounds, and a mixture thereof, and the actinic light projected is one kind of light selected from the group consisting of ultraviolet rays having a wavelength of 300 nm or less, electron beams and ion beams when the photosensitive material belongs to the above-mentioned group (a) and the actinic light projected is at least one kind of light selected from the group consisting of ultraviolet rays covering the whole wavelength range, electron beams and ion beams when the photosensitive material belongs to the above-mentioned group (b).

The above-mentioned compounds of group (a) have the following characteristic properties:

(i) Upon contact with metallic ions such as Ag, Pd, Pt, Hg, Cu, Ni, etc., they reduce the metallic ions and deposit metal particles.

(ii) When the $-M-M-(-M)_{\overline{n}}$ linkage in the compounds is cloven, they lose the ability to reduce metallic ions.

(iii) The $-M-M-(-M)_{\overline{n}}$ linkage in the compounds is easily cloven by irradiating them with ultraviolet rays having a wavelength shorter than 300 nm, electron beams or ion beams.

The mixtures belonging to the above-mentioned group (b) have the following characteristic property (iv) in addition to the above-mentioned properties (i) and (ii):

(iv) the $-M-M-(-M)_{\overline{n}}$ linkage of the polymetal compound in said mixtures is easily cloven by irradiating it with ultraviolet rays having not only a wavelength shorter than 300 nm but also a wavelength of 300 nm or longer, electron beams or ion beams.

Accordingly, a metallic image can be formed from said compound (a) by attaching a solution of said compound (a) in an organic solvent to the surface and through-hole part of the substrate having through-holes, drying the solution, irradiating the substrate with ultraviolet rays having a wavelength of 300 nm or less and preferably a wavelength of 300–50 nm, electron beams or ion beams through a photo-mask, and then contacting the substrate with a solution of metallic salt such as silver salt solution to deposit particles of metal such as silver on the unexposed part.

A metallic image can be formed from said mixture (b) in the same manner as in the above-mentioned formation of metallic image from compound (a), except that the selective exposure is carried out with ultraviolet rays of the whole wavelength range and preferably with ultraviolet rays having a wavelength of 320–500 nm, electron beams or ion beams. The exposure may be carried out at a wavelength longer than 300 nm in this case, because the above-mentioned photosensitizer is used. As photo-mask, those made of inexpensive glass or organic film base can be used.

When said photosensitizer is used, the sensitivity is better than that in the case of using no sensitizer even if the irradiation is carried out at a short-wavelength of 300 nm or less.

Hereunder, the materials, etc., used in this invention will be illustrated.

The substrate is an insulating board made from epoxy resin, phenolic resin, polyimide resin or the like; fiber reinforced insulating boards produced by reinforcing these resins with glass fiber or the like; laminated boards produced by laminating glass cloth or the like and impregnating with these resins; or ceramic plates, glass plate, alumina and the like.

Examples of said polymetal compounds include the following: 1,2-dimethyldisilane, 1,1,1-trichlorotrimethyldisilane, pentamethyldisilanyl cyanide, hexaphenyldisilane, ethoxypentamethyldisilane, octamethyl-1,4-dioxa-2,3,5,6-tetrasilacyclohexane, bis-(pentamethyldisilanyl) ether, tetramethyl-1,2-bis-(pentamethyldisilanoxy)-disilane, 1,1'-bis-(pentamethyldisilanyl)-ferrocene, bis-(pentaethyldisilanyl)-mercury, 1,2,2,3-tetramethyltetraphenyltrisilane, octaphenyltrisilane, octamethyl-1,4-diphenyltetrasilane, tris-(dimethylphenylsilyl)-silane, octamethyl-2,2,4,4-tetraphenylpentasilane, 1,5-bis-(allyloxy)-decaphenylpentasilane, 1,6-dichlorododecamethylhexasilane, 1,1-dimethyldecaphenylcyclohexasilane, hexadecamethylheptasilane, dodecamethyl-1,1,1,8,8,8-hexaphenyloctasilane, dodecamethyl-1,1,1,2,2,9,9,10,10,10-decaphenyldecasilane, tetrabromo-1,2-diphenyldigermane, 1,2-diethyltetraphenyldigermane, hexaphenyldigermane, octaphenyltrigermane, tris-(triphenylgermyl)-germane, decaphenylcyclopentagermane, 1,2-dichlorotetramethylditin, 1,1,1-trimethyltriphenylditin, 1,2-bis-(trichloroacetoxy)-tetraphenylditin, hexaphenylditin, hexa-2-biphenylditin, 1,3-dichlorohexa-n-propyltritin, 1,4-dichlorooctaethyltetratin, octa-tert-butylcyclotetratin, octabenzylcyclotetratin, tetrakis-(triphenylstannyl)-tin, dodecaphenylcyclohexatin, dodeca-$\beta$-naphthylcyclohexatin and the like.

Examples of said photosensitizer include the followings: 2-nitrofluorene, 2,4,7-trinitrofluorene, 2,4,5,7-tetranitrofluorene, benzophenone, 4-methoxybenzophenone, 4,4'-dimethoxybenzophenone, 3-methoxybenzophenone, 4,4'-dibromobenzophenone, 4,4'-dichlorobenzophenone, 3-chlorobenzophenone, 4-cyanobenzophenone, 2,4-dimethylbenzophenone, 4-phenylbenzophenone, 4,4'-bis-(dimethylamino)-benzophenone, acetophenone, 3-cyanoacetophenone, 4-methylacetophenone, 3-bromoacetophenone, 2,4,6-trimethylacetophenone, 4-chloroacetophenone, 4-methoxyacetophenone, 4-phenylacetophenone, benzil, 4,4'-dimethoxybenzil, 4,4'-dibromobenzil, benzoin, benzoin methyl ether, benzoin ethyl ether, benzoin isopropyl ether, benzoin acetate and the like.

Said photosensitizer is blended into said polymetal compound preferably in a proportion of at least one molecule of photosensitizer per one —M—M$\leftarrow$M$)_{\overline{n}}$ linkage in the polymetal compound.

Said polymetal compound or a mixture of said polymetal compound and said photosensitizer can be attached to the substrate by dissolving them into an organic solvent and applying the solutoin by the well-known method such as a dip method, spin coating method, spray method or the like. For the purpose of improving the coating properties of photosensitive material and its adhesion to the substrate, a polymer such as butadiene resin, epoxy resin, polyester resin or the like can be further added to the photosensitive material.

As the solvent (c), there can be used halogenated hydrocarbons such as 1,2-dichloroethane, 1,1,2-trichloroethane, carbon tetrachloride and the like; aromatic hydrocarbons such as benzene, benzene derivatives, e.g., dichlorobenzene, and the like; heterocyclic compounds such as tetrahydrofuran, and the like; and a mixture thereof.

The coating film formed on the substrate is heated by a usual method.

The selective exposure of the polymetal compound (group (a)) formed on the substrate is carried out by irradiating it with an actinic light such as ultraviolet rays having a wavelength of 300 nm or less, generated by a Xe-Hg lamp, a chemical lamp, a high pressure mercury lamp or the like through a photo-mask, or electron beams or ion beams.

The selective exposure of the mixture of polymetal compound and photosensitizer (group (b)) formed on the substrate is carried out by irradiating it with an actinic light such as ultraviolet rays of whole wavelength range generated by a Xe-Hg lamp, a chemical lamp, a high pressure mercury lamp or the like, or electron beams or ion beams.

In depositing metal particles and forming a metallic image on the selectively unexposed part, a metallic salt solution prepared by dissolving an inorganic salt, an organic acid salt or a complex salt of Ag, Pd, Pt, Au, Hg, Ni, Cu or the like into water, an organic solvent such as ethanol or their mixture or, if necessary, a mixture prepared by adding a stabilizer, a reducing assistant for metallic ions and the like to the above-mentioned metallic salt solution is attached by the method or dipping, spraying or the like. The deposition of metal particles can be accelerated by elevating the temperature of the solution.

The metallic image thus formed is washed with water, an organic solvent or the like and then dried.

Hereunder, this invention will be explained with reference to examples.

EXAMPLE 1

Photosensitive solution A of the following composition containing a polymetal compound was prepared:

| Photosensitive solution A | |
|---|---|
| Hexaphenyldisilane (synthetic product) | 0.1 part by weight |
| 1,2-Dichloroethane (guaranteed reagent) | 99.9 parts by weight |

By the use of a drill, through-holes of 1 mm $\phi$ were bored through a glass-epoxy substrate (manufactured by Hitachi Chemical Co.) with a pitch of 3 mm. The substrate was washed with water, washed with isopropyl alcohol and dried at 80° C. for 10 minutes, after which the substrate was dipped in the photosensitive solution A, pulled up at a speed of 10 cm/min and dried at 50° C. for 10 minutes to form a coating film of hexaphenyldisilane on the substrate surface including the through-hole wall surfaces. Then, the substrate was exposed to ultraviolet rays by means of a Xe-Xg lamp (manufactured by Ushio Electric Inc.) under such conditions as the intensity at the wavelength of 254 nm of 10 mW/cm² for a time period of 5 minutes through a quarz photo-mask of quarz base having a light-screening part formed of chromium film. Then, the exposed substrate was dipped in a 1% (by weight) ethanolic solution of AgClO$_4$ for 1 minute, pulled up, washed with hot water of 40° C. and dried at 80° C. for 10 minutes.

As a result, a clear pattern of Ag metal particles was formed on the unexposed part of the substrate in conformity to the photo-mask pattern. Ag metal particles were uniformly deposited also on the through-hole wall surfaces which were not exposed to light.

Subsequently, the substrate was dipped in an electroless copper plating solution (trade name: Top-Metallate Bath, manufactured by Okuno Seiyaku Kogyo K. K.) for 3 hours, and then washed with water and dried at 80° C. for 10 minutes. As a result, copper was deposited only on the Ag metal particle pattern previously formed, and no deposition of copper occurred on other parts. Further, copper was deposited uniformly also on the wall surfaces of through-holes.

EXAMPLE 2

Photosensitive solution B of the following composition containing a polymetal compound was prepared:

| Photosensitive solution B | |
|---|---|
| Bis-(pentamethyldisilanyl) ether (synthetic product) | 0.1 part by weight |
| 1,2-Dichloroethane (guaranteed reagent) | 99.9 parts by weight |
| Resin type butadiene-acrylontrile copolymer (trade name: EC 776, manufactured by 3M Co.) | 0.5 part by weight |

In the same manner as in Example 1, the photosensitive solution B was coated on a glass epoxy substrate having through-holes and exposed to the light. Then it was dipped in a 1% (by weight) aqueous solution of PdCl$_2$ for one minute, pulled up, washed with water and dried at 80° C. for 10 minutes. As a result, a Pd metal particle pattern was formed with high accuracy on the unexposed part of substrate in conformity to the photomask pattern. Pd metal particles were deposited uniformly also on the wall surfaces of the through-holes which were not exposed to light.

Subsequently, the substrate was dipped in the electroless copper plating solution in the same manner as in Example 1. As a result, copper was deposited uniformly only on the part on which Pd metal particles had been deposited.

EXAMPLE 3

Photosensitive solution C of the following composition containing a polymetal compound was prepared:

| Photosensitive solution C | |
|---|---|
| 1,6-Dichlorododecamethylhexasilane (synthetic product) | 0.1 part by weight |
| 1,2-Dichloroethane (guaranteed reagent) | 99.9 parts by weight |

In the same manner as in Example 1, through-holes were bored through a paper-phenolic resin substrate (manufactured by Hitachi Chemical Co.), and the substrate was washed, dried and coated with the photosensitive solution C. Then it was exposed to the light and dipped in the metallic salt solution, in the same manner as in Example 1. As a result, Ag metal particles were uniformly deposited only on the unexposed part. Subsequently, it was dipped in the electroless copper plating solution in the same manner as in Example 1. As a result, copper was deposited uniformly only on the part on which Ag metal particles had been deposited.

EXAMPLE 4

Photosensitive solution D of the following composition containing a polymetal compound was prepared:

| Photosensitive solution D | |
|---|---|
| 1,1-Dimethyldecaphenylcyclohexasilane (synthetic product) | 0.1 part by weight |
| 1,2-Dichloroethane (guaranteed reagent) | 99.9 parts by weight |

In the same manner as in Example 1, a 96% alumina substrate (manufactured by Hitachi Chemical Co.) was coated with the photosensitive solution D, exposed to the light and dipped in the metallic salt solution. As a result, Ag metal particles were uniformly deposited only on the unexposed part. Subsequently, the substrate was dipped in the electroless copper plating solution in the same manner as in Example 1. As a result, copper was uniformly deposited only on the part on which Ag metal particles had been deposited.

EXAMPLE 5

Photosensitive solution E of the following composition containing a polymetal compound was prepared:

| Photosensitive solution E | |
|---|---|
| Tetrabromo-1,2-diphenyldigermane (synthetic product) | 0.1 part by weight |
| 1,2-Dichloroethane (guaranteed reagent) | 99.9 parts by weight |

A glass epoxy substrate prepared in the same manner as in Example 1 was coated with the photosensitive solution E, exposed to the light and dipped in the metallic salt solution in the same manner as in Example 1. As a result, Ag metal particles were uniformly deposited only on the unexposed part.

Subsequently, the substrate was dipped in the electroless plating solution in the same manner as in Example 1. As a result, copper was uniformly deposited only on the part on which Ag metal particles had been deposited.

EXAMPLE 6

Photosensitive solution F of the following composition containing a polymetal compound was prepared:

| Photosensitive solution F | |
|---|---|
| Decaphenylcyclopentagermane (synthetic product) | 0.1 part by weight |
| 1,2-Dichloroethane (guaranteed reagent) | 99.9 parts by weight |
| Resin type butadiene-acrylonitrile copolymer (trade name EC 776, manufactured by 3M Co.) | 0.25 part by weight |

A glass substrate having a roughened surface was coated with the photosensitive solution F, exposed to the light and dipped in the metallic salt solution in the same manner as in Example 1. As a result, Ag metal particles were uniformly deposited only on the unexposed part.

EXAMPLE 7

Photosensitive solution G of the following composition containing a polymetal compound was prepared:

| Photosensitive solution G | |
|---|---|
| Hexaphenylditin (synthetic product) | 0.1 part by weight |
| 1,2-Dichloroethane (guaranteed | |

-continued

| Photosensitive solution G | |
|---|---|
| reagent) | 99.9 parts by weight |

A glass epoxy substrate prepared in the same manner as in Example 1 was coated with the photosensitive solution G, exposed to the light and dipped in the metallic salt solution in the same manner as in Example 1. As a result, Ag metal particles were uniformly deposited only on the unexposed part. Subsequently, this substrate was dipped in the electroless copper plating solution in the same manner as in Example 1. As a result, copper was uniformly deposited only on the part on which Ag metal particles had been deposited.

EXAMPLE 8

Photosensitive solution H of the following composition containing a polymetal compound was prepared:

| Photosensitive solution H | |
|---|---|
| 1,4-Dichlorooctaethyltetratin (synthetic product) | 0.1 part by weight |
| 1,2-Dichloroethane | 99.9 parts by weight |

A glass epoxy substrate prepared in the same manner as in Example 1 was coated with the photosensitive solution H, exposed to the light and dipped in the metallic salt solution in the same manner as in Example 1. As a result, Ag metal particles were deposited only on the unexposed part. Subsequently, this substrate was dipped in the electroless copper plating solution in the same manner as in Example 1. As a result, copper was deposited uniformly only on the part on which Ag metal particles had been deposited.

EXAMPLE 9

As shown in No. 1 to No. 14 of the following table, a phenolic resin laminate board was dipped in a photosensitive solution which comprised 0.1 mole of hexaphenylditin (polymetal compound), 0.15 mole of additive (No. 1 to No. 14 were all different one another in the species of additive) and 1,2-dichloroethane (solvent). Then it was pulled up at a speed of 50 cm/min and dried at 50° C. for 5 minutes. This substrate was closely contacted with a photo-mask made of soda glass and exposed to ultraviolet rays for 10 minutes (a Xe-Hg lamp manufactured by Ushio Electric Inc. was used; the intensity at a wavelength of 365 nm was 14.3 mW/cm$^2$). Then it was dipped in a 1% (by weight) ethanolic solution of AgClO$_4$ for one minute, pulled up, washed with hot water of 40° C. and dried at 80° C. for 5 minutes. As shown in No. 1 to No. 14 of the table, Ag particles giving metallic image were deposited only on the part screened by the photo-mask, and no deposition of Ag particles was noticeable in the part exposed to ultraviolet rays.

TABLE

| | Composition of photosensitive solution | | | |
|---|---|---|---|---|
| No. | Polymetal compound (0.1 mole) | Photosensitizer (0.15 mole) | Solvent (70 moles) | Ag image pattern |
| 1 | (C$_6$H$_5$)$_6$Sn$_2$ | 2-Nitrofluorene | CH$_2$ClCH$_2$Cl | Formed |
| 2 | | 2,4,7-Trinitrofluorene | | Formed |
| 3 | | Benzophenone | | Formed |
| 4 | | 4,4'-Dimethoxy-benzophenone | | Formed |
| 5 | | 4,4'Bis-(dimethylamino)-benzophenone | | Formed |
| 6 | | Acetophenone | | Formed |
| 7 | | 3-Bromoacetophenone | | Formed |
| 8 | | Benzil | | Formed |
| 9 | | 4,4'-Dimethoxy-benzil | | Formed |
| 10 | | Benzoin | | Formed |
| 11 | | Benzoin methyl ether | | Formed |
| 12 | | Benzoin ethyl ether | | Formed |
| 13 | | Benzoin isopropyl ether | | Formed |
| 14 | | Benzoin acetate | | Formed |

EXAMPLE 10

14 Kinds of photosensitive solutions were prepared by dissolving 0.1 mole of 1,6-dichlorododecamethylhexasilane (polymetal compound) and 0.5 mole of sensitizer shown in No. 1 to No. 14 of the table in 70 moles of 1,2-dichloroethane (solvent). Coating of these photosensitive solutions onto substrates, exposure to the light and dipping in AgClO$_4$ solution were carried out in the same manner as in Example 9, after which the formation of Ag particle images was examined. As a result, the formation of Ag particle image patterns was possible like Example 9.

EXAMPLE 11

14 Kinds of photosensitive solutions were prepared by dissolving 0.1 mole of tetrabromo-1,2-diphenyldigermane (polymetal compound) and 0.1 mole of photosensitizer shown in No. 1 to No. 14 of the table in 70 moles of 1,2-dichloroethane (solvent). Coating of these photosensitive solutions onto substrates, exposure to the light and dipping into AgClO$_4$ solution were carried out in the same manner as in Example 9, after which the formation of Ag particle images was examined. As a result, the formation of Ag particle image patterns was possible like Example 9.

EXAMPLE 12

A photosensitive solution was prepared by dissolving 0.1 mole of hexaphenylditin (polymetal compound) and 0.2 mole of benzoin ethyl ether (photosensitizer) in 70 moles of 1,2-dichloroethane (solvent). This photosensitive solution was coated on a glass epoxy substrate having a thickness of 0.6 mm by means of a spinner at a rotation number of 300 rpm, over which a photo-mask made of quarz base was closely contacted. It was irradiated with ultraviolet rays for 120 seconds by the use of the same lamp as in Example 10 and then dipped in the AgClO$_4$ solution, whereby Ag particles were deposited only on the unexposed part.

Subsequently, this substrate was dipped for 3 hours in an electroless copper plating solution (trade name: Top Metallate Bath, manufactured by Okuno Seiyaku Kogyo K.K.), after which it was washed with water and dried at 80° C. for 10 minutes. As a result, copper was uniformly deposited only on the previously formed Ag particle pattern, and no deposition of copper was observed on the other parts. By this, it was evidenced that this invention is effective as a method for forming plating nuclei for electroless plating also.

What is claimed is:

1. A process for forming a metallic image comprising coating a solution of a photosensitive material on the surface of a substrate having through-holes and on the through-hole parts, drying the photosensitive material, irradiating the resulting substrate with an actinic light through a photo-mask, and contacting the resulting substrate with a solution of metallic salt to deposit metal particles on the unexposed portions, characterized in that as the photosensitive material there is used either one of the following (a) or (b):

(a) at least one member selected from organic compounds having in the molecule at least one linkage of the formula: —M—M—(M)$_{\overline{n}}$, wherein M is at least one member selected from the group consisting of Si, Ge and Sn, and n is zero or 1 or more, (b) a mixture of at least one above-mentioned compound (a) and at least one photosensitizer selected from the group consisting of nitrofluorene and derivatives thereof, benzophenone and derivatives thereof, acetophenone and derivatives thereof, benzil and derivatives thereof, benzoin and derivatives thereof, dissolved in a solvent (c) selected from the group consisting of halogenated hydrocarbons, aromatic hydrocarbons, heterocyclic compounds, and a mixture thereof.

2. A process according to claim 1, wherein the photosensitive material is at least one member belonging to the group (a).

3. A process according to claim 2, wherein as the actinic light there is used ultraviolet rays having a wavelength of 300 nm or less, electron beams or ion beams.

4. A process according to claim 1, wherein the photosensitive material is a mixture belonging to the group (b).

5. A process according to claim 4, wherein as the actinic light there is used ultraviolet rays covering the whole wavelength range, electron beams or ion beams.

6. A process according to claim 1, 2, 3, 4 or 5, wherein the organic compound having in the molecule at least one linkage of the formula: —M—M—(M)$_{\overline{n}}$, wherein M is an atom arbitrarily selected from Si, Ge and Sn, and n is a number of 0 or 1 or more, is 1,2-dimethyldisilane, 1,1,1-trichlorotrimethyldisilane, pentamethyldisilanyl cyanide, hexaphenyldisilane, ethoxypentamethyldisilane, octamethyl-1,4-dioxa-2,3,5,6-tetrasilacyclohexane, bis-(pentamethyldisilanyl) ether, tetramethyl-1,2-bis-(pentamethyldisilanoxy)-disilane, 1,1'-bis-(pentamethyldisilanyl)-ferrocene, bis-(pentaethyldisilanyl)-mercury, 1,2,2,3-tetramethyltetraphenyltrisilane, octaphenyltrisilane, octamethyl-1,4-diphenyltetrasilane, tris-(dimethylphenylsilyl)-silane, octamethyl-2,2,4,4-tetraphenylpentasilane, 1,5-bis-(allyloxy)-decaphenylpentasilane, 1,6-dichlorododecamethylhexasilane, 1,1-dimethyldecaphenylcyclohexasilane, hexadecamethylheptasilane, dodecamethyl-1,1,1,8,8,8-hexaphenyloctasilane, dodecamethyl-1,1,1,2,2,9,9,10,1010-decaphenyldecasilane, tetrabromo-1,2-diphenyldigermane, 1,2-diethyltetraphenyldigermane, hexaphenyldigermane, octaphenyltrigermane, tris-(triphenylgermyl)-germane, decaphenylcyclopentagermane, 1,2-dichlorotetramethylditin, 1,1,1-trimethyltriphenylditin, 1,2-bis-(trichloroacetoxy)-tetraphenylditin, hexaphenylditin, hexa-2-biphenylditin, 1,3-dichlorohexa-n-propyltritin, 1,4-dichlorooctaethyltetratin, octa-tert-butylcyclotetratin, octabenzylcyclotetratin, tetrakis-(triphenylstannyl)-tin, dodecaphenylcyclohexatin or dodeca-β-naphthylcyclohexatin.

7. A process according to claim 1, 4 or 5, wherein said photosensitizer is 2-nitrofluorene, 2,4,7-trinitrofluorene, 2,4,5,7-tetranitrofluorene, benzophenone, 4-methoxybenzophenone, 4,4'-dimethoxybenzophenone, 3-methoxybenzophenone, 4,4'-dibromobenzophenone, 4,4'-dichlorobenzophenone, 3-chlorobenzophenone, 4-cyanobenzophenone, 2,4-dimethylbenzophenone, 4-phenylbenzophenone, 4,4'-bis-(dimethylamino)-benzophenone, acetophenone, 3-cyanoacetophenone, 4-methylacetophenone, 3-bromoacetophenone, 2,4,6-trimethylacetophenone, 4-chloroacetophenone, 4-methoxyacetophenone, 4-phenylacetophenone, benzil, 4,4'-dimethoxybenzil, 4,4'-dibromobenzil, benzoin, benzoin methyl ether, benzoin ethyl ether, benzoin isopropyl ether, or benzoin acetate.

8. A process according to claim 1, 2 or 4, wherein the solvent (c) is 1,2-dichloroethane, 1,1,2-trichloroethane or carbon tetrachloride.

* * * * *